United States Patent [19]
North

[11] Patent Number: 6,081,558
[45] Date of Patent: Jun. 27, 2000

[54] APPARATUS AND METHOD FOR LOW POWER OPERATION WITH HIGH SENSITIVITY IN A COMMUNICATIONS RECEIVER

[75] Inventor: Brian B. North, Los Gatos, Calif.

[73] Assignee: Integration Associates, Inc., Mountain View, Calif.

[21] Appl. No.: 08/915,216

[22] Filed: Aug. 20, 1997

[51] Int. Cl.[7] .............................. H03K 9/00; H04L 27/08; H04B 1/06; H03G 3/20

[52] U.S. Cl. ..................... 375/316; 375/345; 455/232.1; 330/129; 250/214 AG

[58] Field of Search .................................... 375/316, 317, 375/345, 319, 318; 330/129, 278, 9; 455/232.1, 234.1, 234.2, 250.1; 250/214 A, 214 AG

[56] References Cited

U.S. PATENT DOCUMENTS

| | | | |
|---|---|---|---|
| 3,619,660 | 11/1971 | Rugo | 307/264 |
| 4,241,455 | 12/1980 | Eibner | 455/600 |
| 4,415,803 | 11/1983 | Muoi | 250/214 |
| 4,425,551 | 1/1984 | Blackmer et al. | 330/261 |
| 4,528,519 | 7/1985 | van Driest | 330/279 |
| 4,757,502 | 7/1988 | Meuriche et al. | 370/104 |
| 4,764,732 | 8/1988 | Dion | 330/59 |
| 4,814,724 | 3/1989 | Tanigawa | 330/288 |
| 4,839,610 | 6/1989 | Mazzucco et al. | 330/278 |
| 4,878,031 | 10/1989 | Main | 330/254 |
| 4,952,867 | 8/1990 | Anderson et al. | 323/273 |
| 4,996,501 | 2/1991 | Sano et al. | 330/279 |
| 5,081,653 | 1/1992 | Saito | 375/98 |
| 5,329,115 | 7/1994 | Lim | 250/214 R |
| 5,361,395 | 11/1994 | Yamamoto | 455/33.2 |
| 5,369,799 | 11/1994 | Tsunoda | 455/234.1 |
| 5,392,171 | 2/1995 | Kovner et al. | 360/65 |
| 5,408,197 | 4/1995 | Miyake | 330/129 |
| 5,450,035 | 9/1995 | Kinoshita | 330/129 |
| 5,452,473 | 9/1995 | Weiland et al. | 455/88 |
| 5,507,023 | 4/1996 | Suganuma et al. | 455/234.1 |
| 5,557,634 | 9/1996 | Balasubramanian | 375/222 |
| 5,585,952 | 12/1996 | Imai et al. | 359/135 |
| 5,706,110 | 1/1998 | Nykanen | 359/169 |
| 5,760,942 | 6/1998 | Bryant | 359/193 |
| 5,767,953 | 6/1998 | McEwan | 356/5.01 |

FOREIGN PATENT DOCUMENTS 2087181 5/1982 United Kingdom .

OTHER PUBLICATIONS

Ernesto Perea "Technology Directions; Optical Interconnects, High Temperature, & Packaging" Feb. 10, 1996, ISSCC96, 8 pages.

IBM Microelectronics "Infrared Transceiver Module–IBM31T1101" Nov. 6, 1996, http:///www.chips.ibm.com.

Temic Semiconductors "TFDS 6000 Integrated Infrared Transceiver Module IrDA" Aug. 1996, 12 pages.

Hewlett–Packard "Infrared Transceiver Preliminary Technical Data HSDL–1100" Nov. 17, 1995.

Novalog, Inc. "SIRFIR™ 4Mbps IrDA Transceiver" Apr. 1996 info@valog.com.

Dr. Keming W. Yeh and Dr. Lichen Wang "An Introduction to the IrDA Standard anbd System Implementation" Wireless System Design May 1996, 11 pages.

Temic Semiconductors "IrDA Compatible Data Transmission" Apr. 1996, pp. 1–18.

Primary Examiner—Chi H. Pham
Assistant Examiner—Khai Tran
Attorney, Agent, or Firm—McDonnell Boehnen Hulbert & Berghoff

[57] ABSTRACT

A method and circuits are shown for managing the power usage of a receiver circuit by controlling bias current in at least some of the subcircuits of the receiver using a bias current control signal which varies responsive to incoming data signal activity. A circuit is shown wherein an automatic gain control signal controls the gain in a current-mode input amplifier by reducing a bias current in the input amplifier when the activity in the incoming data signal is below an automatic gain control threshold and where the gain of the input amplifier increases responsive to a decreasing level of the bias current. A method is shown wherein the power consumption of a receiver circuit is controlled by generating a bias current control signal which corresponds to the level of activity in a received signal and controlling the bias current, in whole or in part, of at least some of the subcircuits of the receiver using the bias current control signal. Another circuit is shown wherein a data signal monitor circuit is used to monitor the activity in the received data signal and generate an activity signal which controls an adaptive bias circuit. The adaptive bias circuit responds to the activity signal by varying a bias current control signal which controls the bias current in an automatic gain control circuit.

12 Claims, 6 Drawing Sheets

IBIAS = WAKE-UP/Rset + iset (mp4/mp5)
IBIAS (max) = Iset (mp3/mp5)
IBIAS (min) = Iset (mp4/mp5)

APPARATUS AND METHOD FOR LOW POWER OPERATION WITH HIGH SENSITIVITY IN A COMMUNICATIONS RECEIVER

BACKGROUND OF THE INVENTION

The present invention relates to a circuit and method for low power operation in a communications receiver during periods when no transmission activity is present which simultaneously maintains high sensitivity to incoming transmission signals.

Infrared wireless data communication is a useful method for short range (in the approximate range of 0–10 meters) wireless transfer of data between electronic equipment; such as, cellular phones, computers, computer peripherals (printers, modems, keyboards, cursor control devices, etc.), electronic keys, electronic ID devices, and network equipment. Infrared wireless communication devices typically have the advantages of smaller size, lower cost, fewer regulatory requirements, and a well defined transmission coverage area as compared to radio frequency wireless technology (i.e. the zone of transmission is bounded by physical walls and therefore more useful in an office environment). In addition, infrared wireless communication has further advantages with regard to reliability, electromagnetic compatibility, multiplexing capability, easier mechanical design, and convenience to the user as compared to cable based communication technology. As a result, infrared data communication devices are useful for replacing 0–10 meter long data transfer cables between electronic devices, provided that their size and costs can be reduced to that of comparable cable technology. As examples of the type of wireless communications links that are presently in use, the Infrared Data Association (IrDA) Physical Layer Link Specification 1.1e specifies two main physical layer infrared modulation protocols.

Infrared data communications devices typically consist of transmitter and receiver components. The infrared data transmitter section consists of one or more infrared light emitting diodes (LEDs), an infrared lens, and an LED current driver. A conventional infrared data receiver typically consists of an infrared photodiode and a high gain receiver amplifier with various signal processing functions, such as automatic gain control (AGC), background current cancelling, filtering, and demodulation. For one-directional data transfer, only a transmitter at the originating end and a receiver at the answering end is required. For bi-directional communication, a receiver and transmitter at each end is required. A combined transmitter and receiver is called a transceiver.

In typical high volume applications, it is now standard practice to fabricate the receiver circuitry and transmitter driver in a single integrated circuit (IC) to produce a transceiver IC. In turn, a transceiver IC, infrared photodiode and LED along with lenses for the photodiode and LED are assembled together in a plastic molded package designed to be small in size and allow placement in the incorporating electronic device so as to have a wide angle of view (typically through an infrared window on its case). The transceiver IC is designed to digitally interface to some type of serial data communications device such as an Infrared Communication Controller (ICC), UART, USART, or a microprocessor performing the same function.

Figure 1:
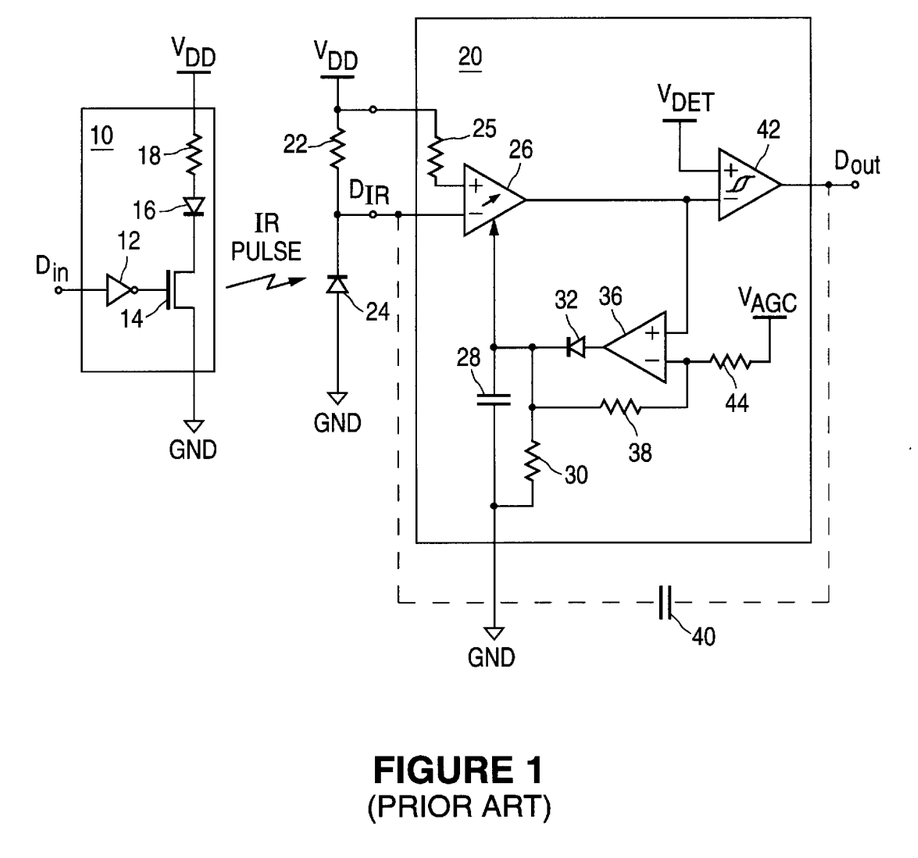
FIG. 1 is a circuit diagram of a conventional infrared transmitter receiver pair.

A representative example of a conventional infrared data transmitter and receiver pair is shown in FIG. 1. Infrared transmitter 10 includes LED 16 which generates a modulated infrared pulse in response to transistor 14 being driven by the data signal input at $D_{IN}$. The modulated infrared signal is optically coupled to an infrared detector, such as photodiode 24 normally operated in current mode (versus voltage mode) producing an output current which is a linear analog of the optical infrared signal falling on it. The infrared pulses generated by LED 16 strike photodiode 24 causing it to conduct current responsive to the data signal input at $D_{IN}$ thereby generating a data signal received at $D_{IR}$.

In receiver 20, the signal received at $D_{IR}$ is transformed into a voltage signal $V_{IR}$ and amplified by amplifier 26. The signal output from amplifier 26 then feeds into comparator 42 which demodulates the received signal by comparing it to a detection threshold voltage $V_{DET}$ in order to produce a digital output data signal at $D_{OUT}$.

The received signal waveform will have edges with slope and will often include a superimposed noise signal. As a result, $V_{DET}$ is ideally placed at the center of the received signal waveform so that the output data signal has a consistent waveform width despite the slope of the received signal edges. Also, placing $V_{DET}$ at the center of the received signal improves the noise immunity of receiver 20 because the voltage difference between $V_{DET}$ and both the high and low levels of the received signal is maximized such that noise peaks are less likely to result in spurious transitions in $D_{OUT}$.

The received signal, however, can vary in amplitude by several orders of magnitude due primarily to variations in the distance between transmitter 10 and receiver 20. The strength of the received signal decreases proportional to the square of the distance. Depending on the range and intensity of the infrared transmitter, the photodiode outputs signal current in the range of 5 na to 5 ma. plus DC and AC currents arising from ambient infrared sources of sunlight, incandescent and fluorescent lighting. As a consequence, the center of the received signal waveform will vary, whereas $V_{DET}$ must generally be maintained at a constant level. To address this problem, receivers typically include an automatic gain control (AGC) mechanism to adjust the gain responsive to the received signal amplitude. The received signal is fed to AGC peak detector 36 which amplifies the signal and drives current through diode 32 into capacitor 28 when the signal exceeds the AGC threshold voltage $V_{AGC}$ in order to generate a gain control signal. The gain control signal increases in response to increasing signal strength and correspondingly reduces the gain of amplifier 26 so that the amplitude of the received signal at the output of amplifier 26 remains relatively constant despite variations in received signal strength.

At a minimum, infrared receiver 20 amplifies the photodetector signal current and then level detects or demodulates the signal when it rises above the detect threshold $V_{DET}$ thereby producing a digital output pulse at $D_{OUT}$. For improved performance, the receiver may also perform the added functions of blocking or correcting DC and low frequency AC ambient (1–300 ua) signals and Automatic Gain Control (AGC) which improves both noise immunity and minimizes output pulse width variation with signal strength.

Data can be modulated on the infrared transmitted signal by a number of well known methods. One popular method is defined by the Infrared Data Association (IrDA). IrDA Physical Layer Link Specification 1.1e specifies two main physical layer infrared modulation methods. One method is a low-speed (2 Kbp/s to 1.15 Mbp/s) on-off infrared carrier, a synchronous modulation where the presence of a pulse indicates a 0 bit and the absence of a pulse indicates a 1 bit. The second method is a high speed (4 Mb/s) synchronous Four Pulse Position Modulation (4 PPM) method in which the time position of a 125 ns infrared pulse in a 500 ns frame encodes two bits of information. Communications protocols often include a preamble, which for the 1.1e specification is sixteen repeated transmissions of a predetermined set of symbols.

An important characteristic of many data link systems, such as those for the infrared (IR) applications described above, is that the transmission channel is idle for a large portion of the time. These systems are characterized by data transfer which often occurs in relatively short bursts that are followed by extended periods when no incoming signal activity is present. The average power consumption of the receiver circuit for such systems is therefore dominated by the current consumption in the idle or no-signal present condition. Hence the development of a circuit method designed to minimize the idle quiescent current is advantageous and can significantly lower the overall power supply consumption requirements. However, another common aspect of data link receivers is that the required input dynamic range (i.e. the dynamic range of the incoming signal) is very high and that the timing information associated with the edges of the pulses in the incoming signal is important. Therefore, the input must remain highly sensitive in order to sense an incoming signal and respond quickly.

SUMMARY OF THE INVENTION

The present invention relates to a method for the partial powering-down of receiver circuits by adapting the quiescent bias currents of the various blocks involved depending upon the signal strength of an input pulse.

A receiver circuit according to the present invention has an input amplifier with an input terminal that is coupled to an input terminal of the receiver circuit, where the input amplifier receives a gain control signal at a gain control terminal which controls a gain value of the input amplifier. The input amplifier is also a current mode device which has an inverse relationship between the gain of the input amplifier and the gain control signal. An automatic gain control circuit is included which has an input terminal that is coupled to the output terminal of the input amplifier and an output terminal that is coupled to the gain control terminal of the input amplifier. The automatic gain control circuit is configured to generate the gain control signal. A comparator of the receiver circuit has a first input terminal coupled to the output terminal of the input amplifier, a second input terminal which receives a detect threshold voltage and an output terminal that is coupled to the output terminal of the receiver circuit.

An embodiment of a method for current control in a receiver circuit, according to the present invention, includes generating a bias current control signal which corresponds to an activity level of a received data signal and controlling a bias current in the receiver circuit responsive to the bias current control signal. In a refinement of the method above, the step of generating a bias current control signal which corresponds to the activity level of the received data signal includes coupling an input of an automatic gain control circuit to an output of an input amplifier and generating an automatic gain control signal in the automatic gain control circuit as the bias current control signal. In another refinement of the method above, the step of generating a bias current control signal which corresponds to the activity level of the received data signal includes low pass filtering an output signal of the receiver circuit to produce a sample signal and comparing the sample signal to a reference voltage to generate the bias current control signal.

Another embodiment of a receiver circuit according to the present invention is composed of an input amplifier having an input terminal coupled to an input terminal of the receiver circuit and a first comparator having a first input terminal coupled to an output terminal of the input amplifier to form a first circuit node, a second input terminal that receives a detect threshold voltage and an output terminal that is coupled to an output terminal of the receiver circuit. An automatic gain control circuit of the receiver circuit has an input terminal that is coupled to the output terminal of the input amplifier and an output terminal that is coupled to a gain control terminal of the input amplifier. The receiver also includes a data signal monitor circuit having an input terminal that is coupled to either the output terminal of the receiver circuit or the first circuit node, wherein the data signal monitor circuit is configured to monitor a signal received at the input terminal for activity and generate an activity present signal when an average value of the signal received at the input terminal is within a predetermined range and generate a no-activity present signal when the average value of the signal received at the input terminal is outside the predetermined range. A reference circuit is included that generates a reference signal. An adaptive bias circuit has a reference input terminal that is coupled to an output terminal of the voltage current reference circuit, an input terminal that is coupled to an output terminal of the data signal monitor circuit and an output terminal that is coupled to the bias control terminal of the automatic gain control circuit, wherein the adaptive bias circuit is configured to output a first bias current control signal at the output terminal responsive to the activity present signal and output a second bias current control signal responsive to the no-activity present signal.

The foregoing and other objects, features and advantages of the invention will become more readily apparent from the following detailed description of a preferred embodiment of the invention which proceeds with reference to the accompanying drawings.

DETAILED DESCRIPTION OF THE PRESENT INVENTION

Figure 2:
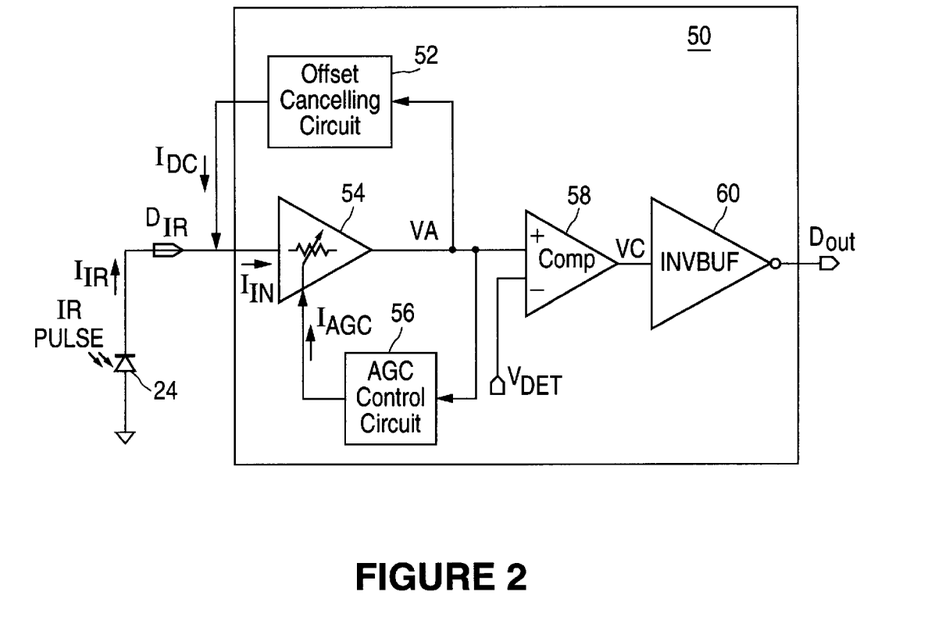
FIG. 2 is a functional block diagram of an embodiment of an infrared receiver according to the present invention.

A simplified functional block diagram of another representative implementation of an IR receiver 50 is shown in FIG. 2. The circuit consists of a variable gain trans-impedance amplifier 54 which converts the current signal $I_{IR}$ received from the photo-diode 24 to a voltage signal $V_{OUT}$ which is then compared to a detect threshold voltage $V_{DET}$ by comparator 58. The output of comparator 58 is used to drive buffer 60 which outputs a recovered data signal at terminal $D_{OUT}$. The offset canceling circuit 52 removes any input referred offsets of the amplifier 54 and any background current from photo-diode 24 present at the input to amplifier 54. The AGC control circuit 56, which can be a circuit similar to the AGC circuit shown in receiver 20 in FIG. 1, monitors the waveform at the input of comparator 58 and outputs AGC control signal $I_{AGC}$, which controls the gain of trans-impedance amplifier 54. The feedback loop composed of AGC control circuit 56 and trans-impedance amplifier 54 attempts to maintain a more or less constant signal level at the input of comparator 58 and thereby compensate for the large dynamic range of the input signal received by photo-diode 24.

When the transmission channel is idle, AGC control circuit 56 will force amplifier 54 into its highest gain state as the circuit will otherwise not be able to determine very weak pulses from the condition where no pulses are present. Most AGC schemes in receivers increase the bias currents in order to increase the overall gain of the receiver. However, in the present invention, amplifier 54 and AGC control circuit 56 are designed so that amplifier 54 consumes the minimum supply current level under a no-signal present condition.

Figure 3:
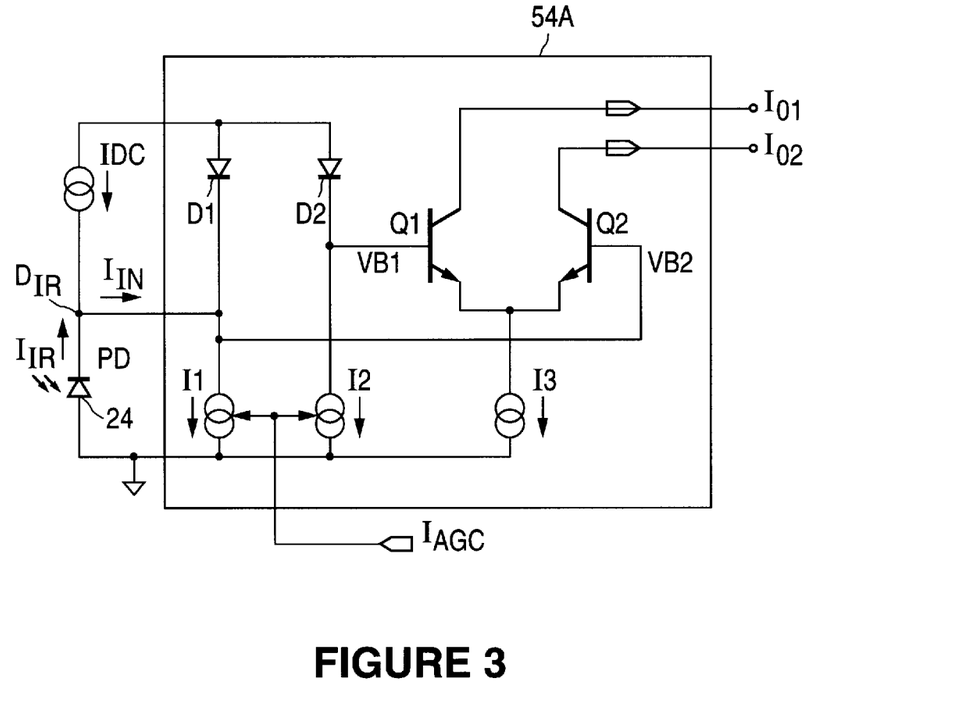
FIG. 3 is a simplified circuit diagram of an embodiment of an input stage of an amplifier in the receiver of FIG. 2.

FIG. 3 illustrates an embodiment of an input stage 54A of amplifier 54 according to the present invention. The technique used is based on the function of a Gilbert gain cell, which includes diodes D1 and D2 along with transistors Q1 and Q2. The complete receive chain of amplifier 54 can consist of one or many such gain cells cascaded, wherein $I_{O1}$ and $I_{O2}$ are complimentary current signals which would be coupled to the base electrodes of the corresponding Q1 and Q2 transistors, respectively, in a subsequent gain cell and the differential current signals are ultimately transformed into a single ended voltage signal output.

$I_{DC}$ is the feedback current from the offset canceling circuit 52 which compensates for any leakage and/or back-light current in the photo-diode. Thus, when no infrared pulses are being received by photo-diode 24, then $I_{IR}$ is completely offset by $I_{DC}$ such that no input data current signal $I_{IN}$ is flowing. Offset canceling circuit 52 also establishes minimum operating currents in diodes D1 and D2 in order to forward bias transistors Q1 and Q2 to have equal current values (i.e. $I_{O1}=I_{O2}$) when no signal is present.

When an infrared signal is active, then $I_{IN}$ is modulated by the received data signal and adds to the current from diode D1 in order to drive transistor Q2, thus modulating the current flowing in Q2 with the received data signal. Because the current in current source I3 is a constant current, the modulations in the current in transistor Q2 are compensated by a corresponding complementary modulation of the current in transistor Q1 resulting in complementary output current signals $I_{O1}$ and $I_{O2}$. During no-signal or low signal strength conditions, $I_{AGC}$ is relatively low which lowers bias currents of current sources I1 and I2 and, therefore, any incoming signal current $I_{IN}$ that is present represents a higher proportion of the current flowing in diode D1 and driving the base of transistor Q2 than when bias currents I1 and I2 are higher. (Current sources I1 and I2 are typically implemented as current mirrors which are driven by a voltage signal to reflect a current in the driving circuit.) The gain of input stage 54A is therefore relatively high. As incoming signal strength increases, $I_{AGC}$, acting as a bias current control signal, increases and drives I1 and I2 to higher levels of bias current causing a corresponding increase in the current in diodes D1 and D2. Thus, the data current signal $I_{IN}$ becomes a relatively smaller proportion of the current in diode D1 thereby lowering the gain of input stage 54A. The performance of input stage 54A can be characterized as:

$I_{out}=I_{O1}-I_{O2}=(I3/I_{AGC}) * I_{IN}$, where $I_{AGC}=I1=I2$ ($I_{AGC}$ is typically determined by a voltage value used to drive the gate of an NMOS current mirror for each of I1 and I2).

An important parameter for this circuit is the minimum AGC control current. Under no-signal conditions, AGC control circuit 56 will force $I_{AGC}$ to near zero thereby yielding the maximum gain in input stage 54A. In practice, however, the quality of the performance of input stage 54A will drop as the bias currents are reduced and, as a result, there are limits on the minimum value of $I_{AGC}$ that can be used.

Figure 4A:
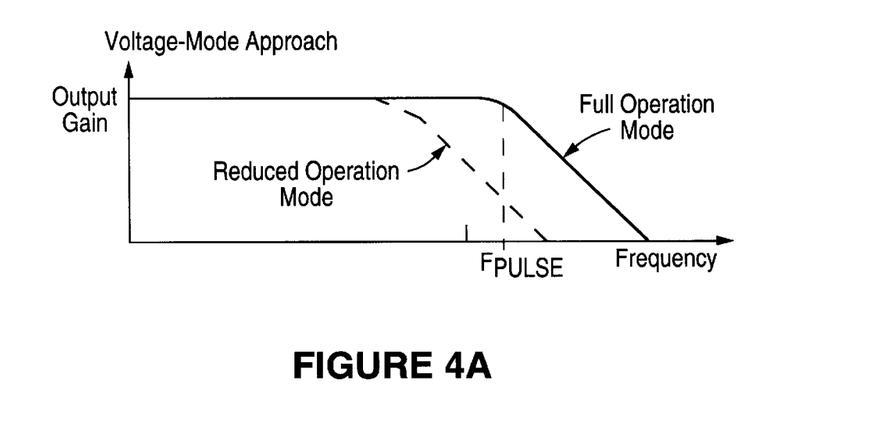
FIG. 4A is a frequency response diagram illustrating the behavior of a voltage-mode device.
Figure 4B:
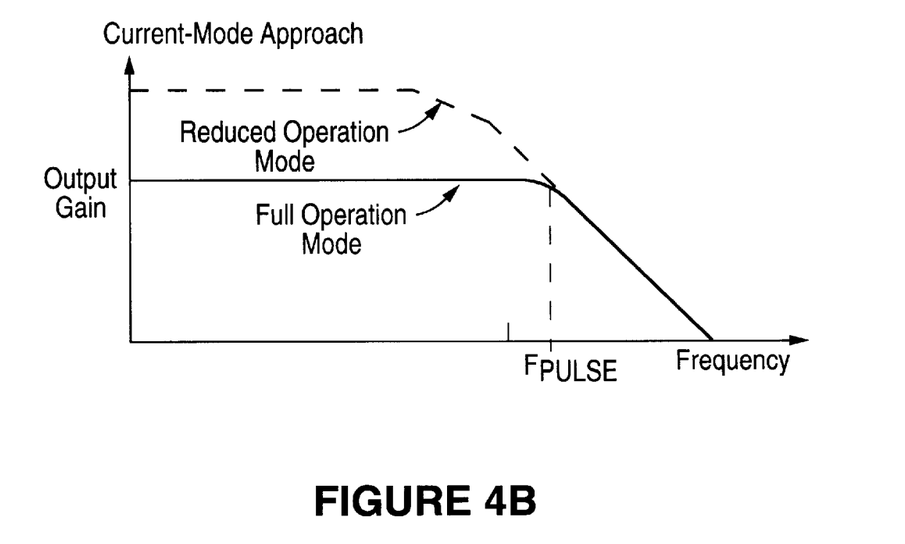
FIG. 4B is a frequency response diagram illustrating the behavior of a current-mode device such as the input stage of FIG. 3.

Infrared receiver 50, according to the present invention, is a current-mode circuit which possesses the characteristic that the gain-bandwidth product remains essentially constant with changes in bias currents, in contrast with the conventional voltage mode approach which does not. This characteristic is illustrated in FIGS. 4A and 4B which show the difference in performance between a voltage mode device, FIG. 4A, and a current mode device, FIG. 4B, when the quiescent current consumption is at a fully operational level, represented by a solid curve, and a reduced operational level, represented by a dashed curve. By careful placement of the 3dB bandwidth point of receiver 50, the current-mode input stage 54A will exhibit an overall gain at the fundamental frequency of the input pulses of the received infrared signal, $F_{PULSE}$, which decreases relatively slowly with the bias current setting. This characteristic allows a large reduction in the quiescent current of the overall circuit below the optimum bias current required for good pulse fidelity, while maintaining input sensitivity which is sufficient to detect an incoming signal. The equivalent voltage mode approach does not permit the bias current to be reduced below the current level required to obtain the full $F_{PULSE}$ bandwidth without a significant loss of input sensitivity.

Thus, the minimum value of the bias currents for receiver 50 is not determined by input signal bandwidth requirements but by other constraints, such as DC offsets and recovery time from over-load. The other constraining factors typically do not become problematic until quiescent bias current levels that are much lower than the levels required for operation with full bandwidth. The present invention therefore permits amplifier 54 to detect input signals when operated at a much lower quiescent bias current than that required for operation which is fully compliant with the data link communications protocol. As the input signal level increases, AGC control circuit 56 rapidly increases $I_{AGC}$, thereby increasing the bias currents I1 and I2 of input stage 54A, so that amplifier 54 is fully compliant with the desired data link specification within a short period of time, such as the time interval occupied by a preamble defined by the specification.

As the quiescent currents increase yet further with the input signal level, the slew-rate and dynamics of amplifier 54 also improve. This is beneficial since it is under high input signal conditions that such parameters become important. Hence the receiver 50 of the present invention makes efficient use of the available bias current throughout a complete range of input signal levels, ranging from no-signal conditions to fully operational bandwidth levels, and ensures good pulse fidelity even for very high input signals.

The AGC control current (or voltage) $I_{AGC}$ which is used to control the main bias setting currents of the variable-gain circuit can be extended to other functions of the receive circuit, such as comparator 58, in order to allow a minimum overall functional operating current to be maintained at very low or idle signal conditions. When a signal of the required minimum value appears then the AGC will increase the overall current consumption to a level that makes the complete circuit compliant to the full performance specification. The speed of the response of the bias adjustment circuits is determined by the time-constant associated with the AGC control circuit 56.

Figure 5:
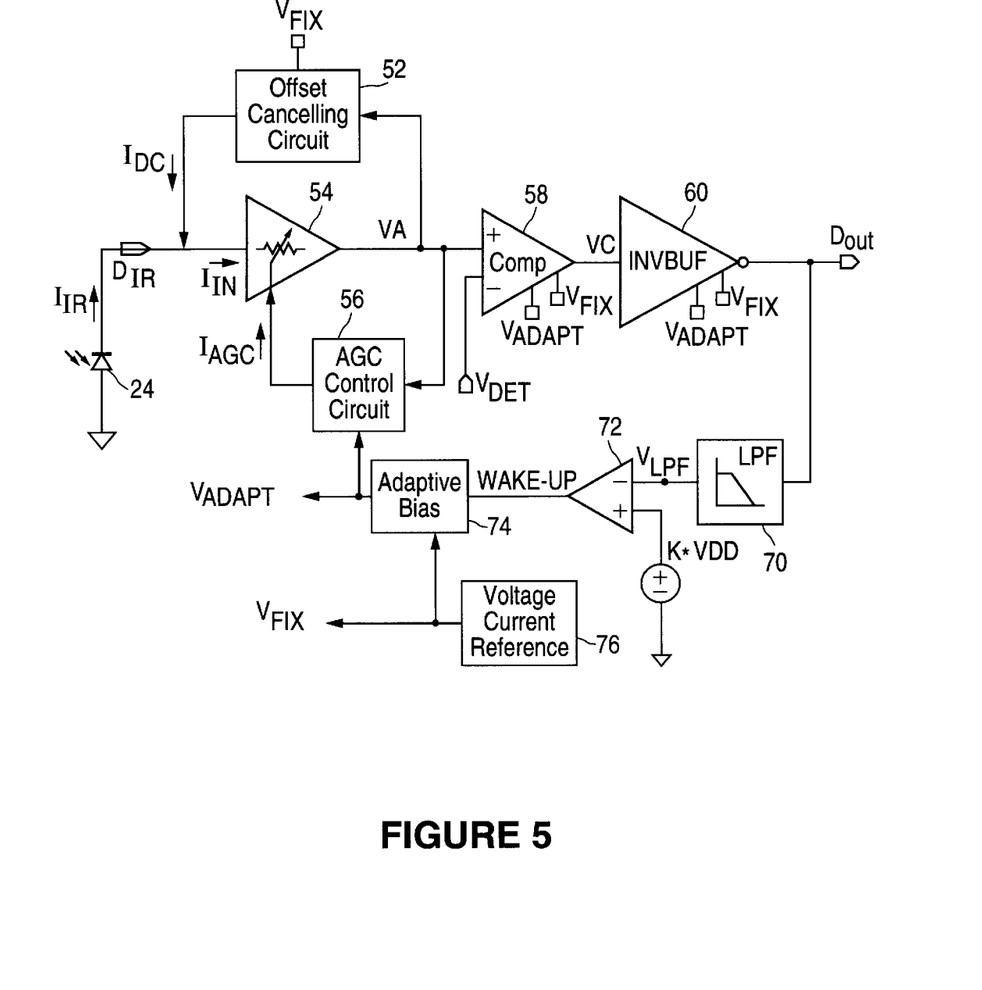
FIG. 5 is a functional block diagram of another embodiment of a receiver according to the present invention.

Alternatively, an additional circuit, such as that shown in FIG. 5, can be used to monitor signal activity and adjust the bias currents of input amplifier 54 and other subcircuits of receiver 50. By adjusting the bias currents, subcircuits directly in the signal path can by partially powered-down and other associated circuits not necessary for signal reception can be completely powered-down during idle conditions.

In FIG. 5, a low-pass filter 70 is coupled to the output of buffer 60 and low pass filters the data signal which is output at $D_{OUT}$. Low-pass filter 70 can be coupled to other points along the receive signal path in other configurations, such as the output of input amplifier 54, so as to obtain a sample signal and monitor the activity of the received signal. The output of low-pass filter 70 is coupled to an input of comparator 72 which compares the output voltage $V_{LPF}$ of low-pass filter 70 to a predetermined threshold reference voltage $K^*V_{DD}$ in order to generate a WAKE-UP signal.

Figure 6:
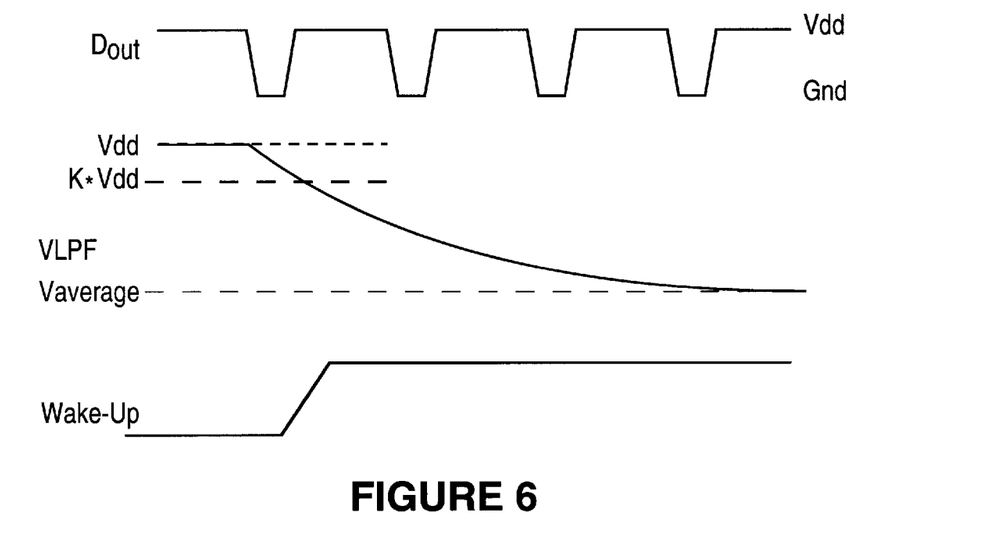
FIG. 6 is a waveform diagram illustrating the function of the receiver of FIG. 5.

The waveforms of FIG. 6 illustrate how low-pass filter 70 and comparator 72 function. When there is no input signal stimuli above the detect threshold voltage $V_{DET}$ of comparator 58, then the signal at $D_{OUT}$ will remain in the inactive state, which in this case is a logic high level or supply voltage $V_{DD}$, and $V_{LPF}$ will also be at approximately $V_{DD}$. Thus, WAKE-UP will be in an inactive state indicating that no activity is present in the input signal. As pulses appear at $D_{OUT}$, $V_{LPF}$ will drop and reach the threshold $K^*V_{DD}$ of sense comparator 72 thereby activating the WAKE-UP signal which indicates that activity is present in the input signal. The limit point $K^*V_{DD}$ at which the WAKE-UP signal becomes active can be configured to be outside the normal operating range of expected average pulse width duty cycles. Through selection of the value of K, sense comparator 72 can be configured to respond to the reception of a single valid pulse or a number of valid pulses, depending upon the time constant of low-pass filter 70, in order to adjust the sensitivity of the WAKE-UP signal to spurious transitions.

The WAKE-UP control signal, as a digital signal, can be utilized to power down sections of the receiver circuit, when the transmission channel is idle, which are not in the direct signal path, such as AGC control circuit 56. Sense comparator 72 can also be an amplifier so that the WAKE-UP signal is configured as an analog signal that can be used to more gradually control the bias currents of subcircuits. For instance, an analog WAKE-UP signal can be used to control current source I1 and I2 of input stage 54A shown in FIG. 3 in order to obtain a more gradual response to signal activity. Also, the WAKE-UP control signal can be a signal generated by a circuit already existing in a receiver, such as the pulse width control voltage generated by the output signal pulse width error correction circuit described in the commonly assigned patent application entitled "APPARATUS AND METHOD FOR OUTPUT SIGNAL PULSE WIDTH ERROR CORRECTION IN A COMMUNICATIONS RECEIVER", Ser. No. 08/864,286, filed May 28, 1997, which is incorporated herein by reference for all purposes. Therefore, additional circuitry for generating the WAKE-UP signal may not be required in order to implement the present invention.

In the embodiment of the present invention illustrated in FIG. 5, the WAKE-UP signal is input to adaptive bias circuit 74 which generates an adaptive bias voltage signal $V_{ADAPT}$ which can be used to variably bias at least some of the subcircuits of the receiver. For instance, the bias currents of AGC control circuit 56 can be controlled by the adaptive bias signal $V_{ADAPT}$ because the AGC control circuit 56 is not directly in the signal path from $D_{IR}$ to $D_{OUT}$ and may therefore be completely powered down when the receiver is idle. Other circuits will not perform adequately if bias current is reduced, such as offset cancelling circuit 52, and therefore require a fixed bias current. Voltage current reference 76 is used to provide a fixed reference bias voltage $V_{FIX}$ which does not vary with signal activity and which is used to bias offset cancelling circuit 52. Still other circuits can be partially powered down without significantly impacting performance, such as comparator 58 and buffer 60, but cannot be completely powered down. $V_{FIX}$ can be used to establish a minimum bias current value for such circuits that is augmented by additional bias current generated in response to $V_{ADAPT}$. To obtain this kind of performance, both comparator 58 and buffer 60, which are shown with inputs of both $V_{FIX}$ and $V_{ADAPT}$, incorporate two current sources connected in parallel where one current source is driven by $V_{FIX}$ and the other by $V_{ADAPT}$. Thus, in the idle signal condition, $V_{ADAPT}$ will reduce the adaptive bias current level to low levels or no current level and $V_{FIX}$ will maintain a minimum bias current level for adequate performance. The current sources in each circuit can be ratioed in order to obtain the level of bias current appropriate for each circuit.

Figure 7:
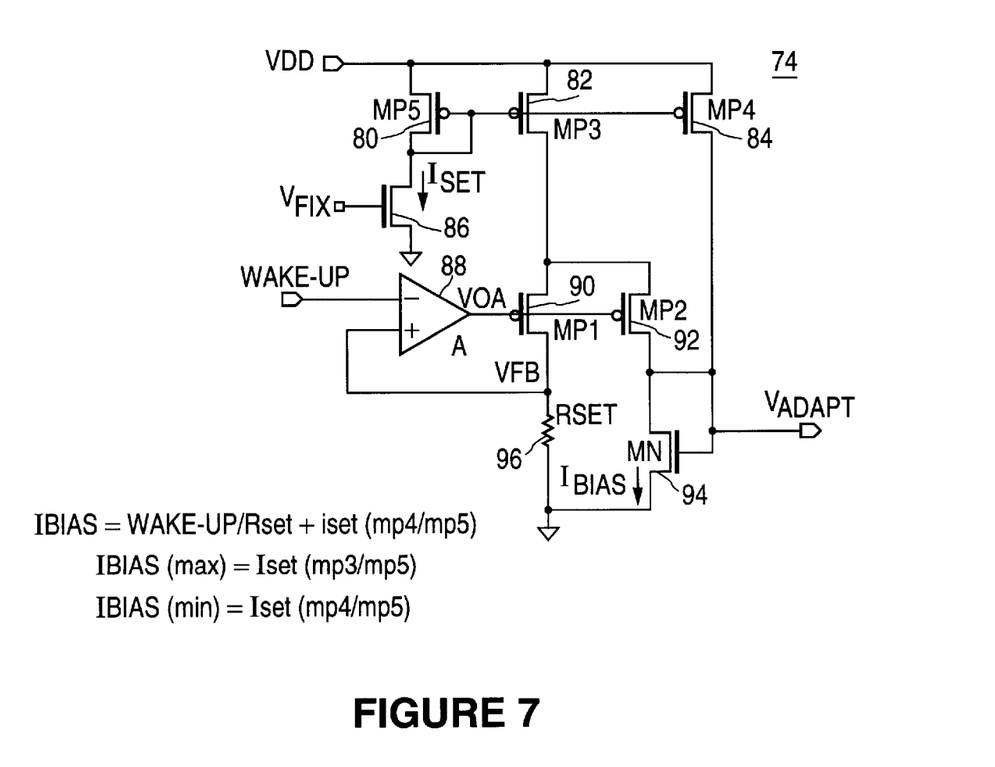
FIG. 7 is a circuit diagram of an input stage of the input amplifier of the receiver of FIG. 5.

Adaptive bias circuit 74 can also be constructed so that it maintains $V_{ADAPT}$ within predetermined limits including a non-zero minimum current level and a maximum current level. An embodiment of an adaptive bias circuit 74 with operating limits is shown in FIG. 7. $V_{FIX}$ is used to establish current $I_{SET}$ in transistor 86 which is used as a reference for adaptive bias circuit 74. $I_{SET}$ also flows in diode-connected transistor 80. The gates of each of transistors 82 and 84 are coupled to the gate of transistor 80. The size ratio of transistor 82 to transistor 80 determines the maximum current level produced by the circuit and the ratio of transistor 84 to transistor 80 determines the minimum current level that will be output by the circuit.

The WAKE-UP signal is input to amplifier 88 which, in turn, drives PMOS transistors 90 and 92. When the WAKE-UP signal is inactive, i.e. at a low voltage level, then the output voltage VOA of amplifier 88 is high and no current flows in transistors 90 and 92. Thus, the current supplied to transistor 94 is sourced only by transistor 84 and the bias current $I_{BIAS}$ is the minimum current level determined by $I_{SET}*(size_{84}/size_{80})$. When WAKE-UP increases in magnitude, then VOA will decrease and turn on transistors 90 and 92. The flow of current through transistor 92 joins with the flow of current through transistor 84 to generate an increasing $I_{BIAS}$ and thus an increasing value of $V_{ADAPT}$. Amplifier 88 also has a feedback path from resister 96, which has a resistance $R_{SET}$ and is connected in series with transistor 90, to make amplifier 88 a voltage follower so that $I_{BIAS}$ can be characterized by $I_{BIAS}=(WAKE\text{-}UP/R_{SET})+ISET*(size_{84}/size_{80})$. $V_{ADAPT}$ is thus a current mirror voltage level that can be used to drive current mirrors in the other subcircuits of the receiver in order to control the bias current of those subcircuits.

Figure 8:
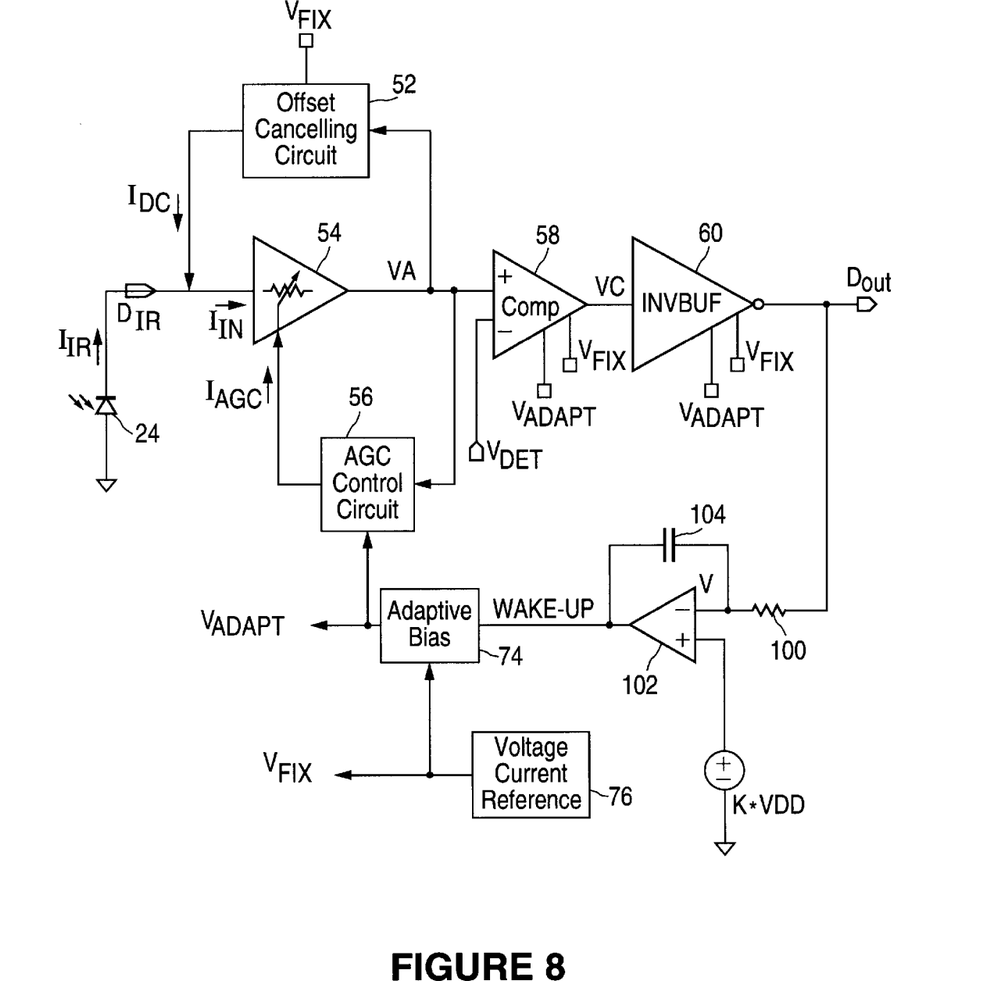
FIG. 8 is a circuit diagram of yet another embodiment of a receiver according to the present invention.

FIG. 8 shows yet another embodiment of a receiver circuit according to the present invention. In FIG. 8, low-pass filter 70 and comparator 72 are replaced with an integration amplifier made up of resistor 100, amplifier 102 and capacitor 104. The activity in the data signal output at $D_{OUT}$ is integrated by capacitor 104. When the integrated value of the data signal drops to the level of $K*V_{DD}$, then WAKE-UP becomes active and drives adaptive bias circuit 74 to raise bias currents in the subcircuits of the receiver under the control of $V_{ADAPT}$. As an example of how existing subcircuits of a receiver can be used to generate the WAKE-UP signal, the output of amplifier 102 can also be used in place of $V_{DET}$ as an input to comparator 58, as described in the commonly assigned patent application entitled "APPARATUS AND METHOD FOR OUTPUT SIGNAL PULSE WIDTH ERROR CORRECTION IN A COMMUNICATIONS RECEIVER".

Having illustrated and described the principles of the present invention in the context of the embodiments described above, it should be readily apparent to those skilled in the art that the invention can be modified in arrangement and detail without departing from such principles. For example, while the present invention is described above in the context of an infrared receiver, it should be readily understood that the present invention is applicable to other signal receivers without departing from the scope and spirit of the present invention.

I claim:

1. A receiver circuit, the circuit comprising:

an input terminal configured to receive an input data current signal;

an output terminal;

an input amplifier having input, output and gain control terminals, the input terminal of the input amplifier being coupled to the input terminal of the receiver circuit, and wherein the input amplifier is configured to receive a gain value of the input amplifier, and further wherein the input amplifier is a current mode device which has an inverse relationship between the gain of the input amplifier and the gain control signal;

an automatic gain control circuit having input and output terminals, the input terminal being coupled to the output terminal of the input amplifier and the output terminal being coupled to the gain control terminal of the input amplifier, wherein the automatic gain control circuit is configured to generate the gain control signal;

a comparator having first and second input terminals and an output terminal, the first input terminal being coupled to the output terminal of the input amplifier, the second input terminal being configured to receive a detect threshold voltage and the output terminal of the comparator being coupled to the output terminal of the receiver circuit; and an offset cancelling circuit having input and output terminals, the input terminal of the offset cancelling circuit being coupled to the output terminal of the input amplifier and the output terminal being coupled to the input terminal of the input amplifier, wherein the offset cancelling circuit is configured to generate a DC offset current; and wherein the input amplifier includes:

a first diode having anode and cathode terminals, the anode terminal being coupled to the output terminal of the offset cancelling circuit and cathode terminal being coupled to the input terminal of the input amplifier;

a first current source having first and second current terminals and a control terminal, the first current terminal being coupled to the input terminal of the input amplifier, the second current terminal being coupled to a ground potential terminal, and the control terminal of the first current source being coupled to the gain control terminal of the input amplifier;

a second diode having anode and cathode terminals, the anode terminal of the second diode being coupled to the output terminal of the offset cancelling circuit;

a second current source having first and second current terminals and a control terminal, the first current terminal of the second current source being coupled to the cathode terminal of the second diode, the second current terminal of the second current source being coupled to the ground potential terminal, and the control terminal of the second current source being coupled to the gain control terminal of the input amplifier;

a constant current source having first and second current terminals, the second current terminal of the constant current source being coupled to the ground potential terminal;

a first transistor having emitter, collector and base terminals, the emitter terminal of the first transistor being coupled to the first current terminal of the constant current source and the base terminal of the first transistor being coupled to the first current terminal of the second current source;

a second transistor having emitter, collector and base terminals, the emitter terminal of the second transistor being coupled to the first current terminal of the constant current source and the base terminal of the second transistor being coupled to the first current terminal of the first current source; and a differential transconductance circuit having first and second input terminals and an output terminal, the first input terminal of the differential transconductance amplifier being coupled to the collector terminal of the first transistor, the second input terminal of the differential transconductance amplifier being coupled to the collector terminal of the second transistor, and the output terminal being coupled to the output terminal of the input amplifier.

2. A receiver circuit, the circuit comprising:

an input terminal configured to receive an input data current signal;

an output terminal;

an input amplifier having input, output and gain control terminals, the input terminal of the input amplifier being coupled to the input terminal of the receiver circuit, and wherein the input amplifier is configured to receive a gain control signal at the gain control terminal of the input amplifier which controls a gain value of the input amplifier, and further wherein the input amplifier is a current mode device which has an inverse relationship between the gain of the input amplifier and the gain control signal;

an automatic gain control circuit having input and output terminals, the input terminal being coupled to the output terminal being coupled to the output terminal of the input amplifier and the output terminal being coupled to the gain control terminal of the input amplifier, wherein the automatic gain control circuit is configured to generate the gain control signal; and a comparator having first and second input terminals and an output terminal, the first input terminal being coupled to the output terminal of the input amplifier, the second input terminal being configured to receive a detect threshold voltage and the output terminal of the comparator being coupled to the output terminal of the receiver circuit, wherein the comparator further includes a bias current control terminal, wherein a bias current of the comparator is configured to be controlled by a bias control signal received at the bias current control terminal of the comparator, the bias current control terminal of the comparator being coupled to the output terminal of the automatic gain control circuit.

3. A method for current control in a receiver circuit, the method comprising the steps:

generating a bias current control signal which corresponds to an activity level of a received data signal;

controlling a bias current in the receiver circuit responsive to the bias current control signal; and wherein the step of generating a bias current control signal which corresponds to the activity level of the received data signal includes:
low pass filtering an output signal of the receiver circuit to produce a sample signal; and
comparing the sample signal to a reference voltage to generate the bias current control signal.

4. The method of claim 3, wherein the step of controlling a bias current in the receiver circuit responsive to the bias current control signal includes:

driving a current source in an input stage of the input amplifier with the automatic gain control signal.

5. The method of claim 3, wherein the step of controlling a bias current in the receiver circuit responsive to the bias current control signal includes:

incorporating a current mirror circuit into at least one subcircuit of the receiver circuit; and driving the current mirror circuit with the bias current control signal.

6. A method for current control in a receiver circuit, the method comprising the steps:

generating a bias current control signal which corresponds to an activity level of a received data signal;

controlling a bias current in the receiver circuit responsive to the bias current control signal; and wherein the step of generating a bias current control signal, which corresponds to the activity level of the received data signal includes:
integrating an output signal of the receiver circuit to produce a sample signal; and
comparing the sample signal to a reference voltage to generate the bias current control signal.

7. A method for current control in a receiver circuit, the method comprising the steps:

generating a bias current control signal which corresponds to an activity level of a received data signal;

controlling a bias current in the receiver circuit responsive to the bias current control signal; and wherein the step of generating a bias current control signal which corresponds to the activity level of the received data signal includes:
integrating the received data signal to produce a sample signal; and
comparing the sample signal to a reference voltage to generate the bias current control signal.

8. A receiver circuit, the receiver circuit comprising:

input and output terminals, the input terminal being configured to receive a data signal;

an input amplifier having input, output and gain control terminals, the input terminal being coupled to the input terminal of the receiver circuit;

a first comparator having first and second input terminals and an output terminal, the first input terminal being coupled to the output terminal of the input amplifier to form a first circuit node, the second input terminal being configured to receive a detect threshold voltage and the output terminal of the first comparator being coupled to the output terminal of the receiver circuit;

an automatic gain control circuit having input and output terminals and a bias control terminal, the input terminal being coupled to the output terminal of the input amplifier and the output terminal being coupled to the gain control terminal of the input amplifier;

a data signal monitor circuit having input and output terminals, the input terminal of the data signal monitor being coupled to one of the output terminal of the receiver circuit and the first circuit node, wherein the data signal monitor circuit is configured to monitor a signal received at the input terminal of the data signal monitor circuit for activity and generate an activity present signal when an average value of the signal received at the input terminal is within a predetermined range and generate a no-activity present signal when the average value of the signal received at the input terminal is outside the predetermined range;

a reference circuit having an output terminal, the reference circuit being configured to generate a reference signal at the output terminal;

an adaptive bias circuit having input and output terminals and a reference input terminal, the reference input terminal being coupled to the output terminal of the reference circuit, the input terminal of the adaptive bias circuit being coupled to the output terminal of the data signal monitor circuit and the output terminal of the adaptive bias circuit being coupled to the bias control terminal of the automatic gain control circuit, wherein the adaptive bias circuit is configured to output a first bias current control signal at the output terminal of the adaptive bias circuit responsive to the activity present signal and output a second bias current control signal responsive to the no-activity present signal.

9. The receiver circuit of claim 8, wherein the comparator further includes a bias current control terminal, wherein a bias current of the comparator is configured to be controlled by a bias current control signal received at the bias current control terminal, the bias current control terminal being coupled to the output terminal of the adaptive bias circuit.

10. The receiver circuit of claim 8, wherein the data signal monitor circuit further includes:

a low-pass filter having input and output terminals, the input terminal being coupled to the output terminal of the receiver circuit; and a second comparator having first and second input terminals and an output terminal, the first input terminal of the second comparator being coupled to the output terminal of the low-pass filter, the second input terminal of the second comparator being configured to receive a predetermined reference voltage and the output terminal of the second comparator being coupled to the input terminal of the adaptive bias circuit.

11. The receiver circuit of claim 8, wherein the data signal monitor circuit further includes:

an integration amplifier having first and second input terminals and an output terminal, the first input terminal of the integration amplifier being coupled to the output terminal of the receiver circuit, the output terminal of the integration amplifier being coupled to the input terminal of the adaptive bias circuit and the second input terminal of the integration amplifier being configured to receive a predetermined reference voltage; and a capacitor coupled between the first input terminal of the integration amplifier and the output terminal of the integration amplifier.

12. The receiver of claim 8, where the input amplifier is a current controlled device configured to have an inverse relationship between a gain of the input amplifier and a signal received at the gain control terminal, and an inverse relationship between a current consumption of the input amplifier and the gain of the amplifier.

* * * * *